(12) United States Patent
Ngai

(10) Patent No.: US 9,647,668 B2
(45) Date of Patent: May 9, 2017

(54) APPARATUS FOR FLEXIBLE ELECTRONIC INTERFACES AND ASSOCIATED METHODS

(75) Inventor: Tony Ngai, Saratoga (CA)

(73) Assignee: Altera Corporation, San Jose, CA (US)

( * ) Notice: Subject to any disclaimer, the term of this patent is extended or adjusted under 35 U.S.C. 154(b) by 679 days.

(21) Appl. No.: 13/350,662

(22) Filed: Jan. 13, 2012

(65) Prior Publication Data

US 2013/0181257 A1 Jul. 18, 2013

(51) Int. Cl.
*H01L 27/10* (2006.01)
*H03K 19/177* (2006.01)
*H01L 25/065* (2006.01)

(52) U.S. Cl.
CPC ... *H03K 19/17744* (2013.01); *H01L 25/0657* (2013.01); *H01L 2224/16145* (2013.01); *H01L 2224/16225* (2013.01); *H01L 2924/15192* (2013.01); *H01L 2924/15311* (2013.01)

(58) Field of Classification Search
CPC ............... H03K 19/17744; H01L 25/0657
USPC .................................. 257/209, 777
See application file for complete search history.

(56) References Cited

U.S. PATENT DOCUMENTS

| | | | |
|---|---|---|---|
| 6,239,615 B1 * | 5/2001 | Ngai et al. | 326/41 |
| 7,633,165 B2 | 12/2009 | Hsu et al. | 257/763 |
| 7,683,459 B2 | 3/2010 | Ma et al. | 257/621 |
| 7,930,661 B1 | 4/2011 | Trimberger et al. | |
| 8,103,809 B1 * | 1/2012 | Michels et al. | 710/22 |
| 2002/0038401 A1 * | 3/2002 | Zaidi | G06F 13/28 710/305 |
| 2006/0202714 A1 | 9/2006 | Hoang et al. | |
| 2008/0059931 A1 | 3/2008 | Peters et al. | |
| 2008/0170272 A1 * | 7/2008 | Higuchi | G06F 17/5068 358/444 |
| 2010/0026340 A1 | 2/2010 | Hutton et al. | |
| 2010/0283085 A1 | 11/2010 | Bemanian et al. | |
| 2011/0261603 A1 * | 10/2011 | Jones et al. | 365/63 |
| 2012/0068229 A1 * | 3/2012 | Bemanian | H01L 25/0652 257/209 |

FOREIGN PATENT DOCUMENTS

| | | |
|---|---|---|
| CN | 102184149 A | 9/2011 |
| CN | 102232215 A | 11/2011 |
| JP | 10-144870 A | 5/1998 |
| JP | 2002236611 A | 8/2002 |
| JP | 2004-040188 A | 2/2004 |
| JP | 2008193052 A | 8/2008 |

OTHER PUBLICATIONS

Kirk Saban, *Xilinx Stacked Silicon Interconnect Technology Delivers Breakthrough FPGA Capacity, Bandwidth, and Power Efficiency*, 10 pp., Oct. 21, 2011.

* cited by examiner

*Primary Examiner* — Kevin M Picardat

(57) ABSTRACT

A semiconductor die includes at least one flexible interface block. The flexible interface block includes at least one interconnect, and at least one buffer coupled to the at least one interconnect. The flexible interface block further includes a routing interface coupled to circuitry integrated in the semiconductor die, and a controller coupled to provide communication between the routing interface and the at least one buffer.

22 Claims, 13 Drawing Sheets

APPARATUS FOR FLEXIBLE ELECTRONIC INTERFACES AND ASSOCIATED METHODS

TECHNICAL FIELD

The disclosed concepts relate generally to electronic circuitry and, more particularly, to apparatus for flexible or universal electronic interface circuitry, and associated methods.

BACKGROUND

Advances in electronics has allowed increased levels of integration. The technology for fabrication of ICs has contributed to those advances, and has provided a vehicle for integrating a relatively large number of circuits and functions into an IC. As a result, present-day ICs might contain hundreds of millions of transistors. Notwithstanding the large number of transistors, the desired functionality of an electronic device or circuit sometimes entails using the circuitry of more than one IC. To facilitate the implementation of such functionality, sometimes two or more semiconductor die are used and coupled to one another.

SUMMARY

A wide variety of embodiments according to the disclosed concepts may be used to provide apparatus and methods for flexible electronic interfaces. In one exemplary embodiment, a semiconductor die includes one or more flexible interface blocks. The flexible interface block includes at least one interconnect, at least one buffer, a routing interface, and a controller. The at least one buffer is coupled to the at least one interconnect. The routing interface is coupled to circuitry integrated in the semiconductor die. The controller is coupled so as to provide communication between the routing interface and the at least one buffer.

In another exemplary embodiment, an apparatus includes a first semiconductor die that includes a first interface circuit and a first circuit coupled to the first interface circuit. The apparatus also includes a second semiconductor die, including a second circuit, where the second semiconductor die is coupled to the first interface circuit. The first interface circuit provides a customizable interface between the first and second circuits.

In yet another exemplary embodiment, a method is provided for modeling an implementation of an electronic design using a programmable logic device (PLD) integrated in a first semiconductor die and using a circuit integrated in a second semiconductor die. The method is implemented using a computer. The method includes modeling the implementation, using the computer, by representing the circuit as a flexible interface block of the PLD coupled to the circuit.

BRIEF DESCRIPTION OF THE DRAWINGS

The appended drawings illustrate only exemplary embodiments and therefore should not be considered as limiting its scope. Persons of ordinary skill in the art appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts provide apparatus and related techniques for flexible (or universal) electronic interface circuitry. More specifically, the flexible interface circuitry provides a mechanism for coupling two or more semiconductor die. The flexible interface circuitry can be used in a variety of configurations, and can provide efficient and fast interfaces between semiconductor die.

In some instances, two or more semiconductor die are arranged vertically. For example, one semiconductor die may be positioned or stacked above another semiconductor die. Additional semiconductor die may be positioned or stacked above this structure. As described below in detail, the flexible interface circuitry may be used to couple together two or more of the semiconductor die.

Figure 1:
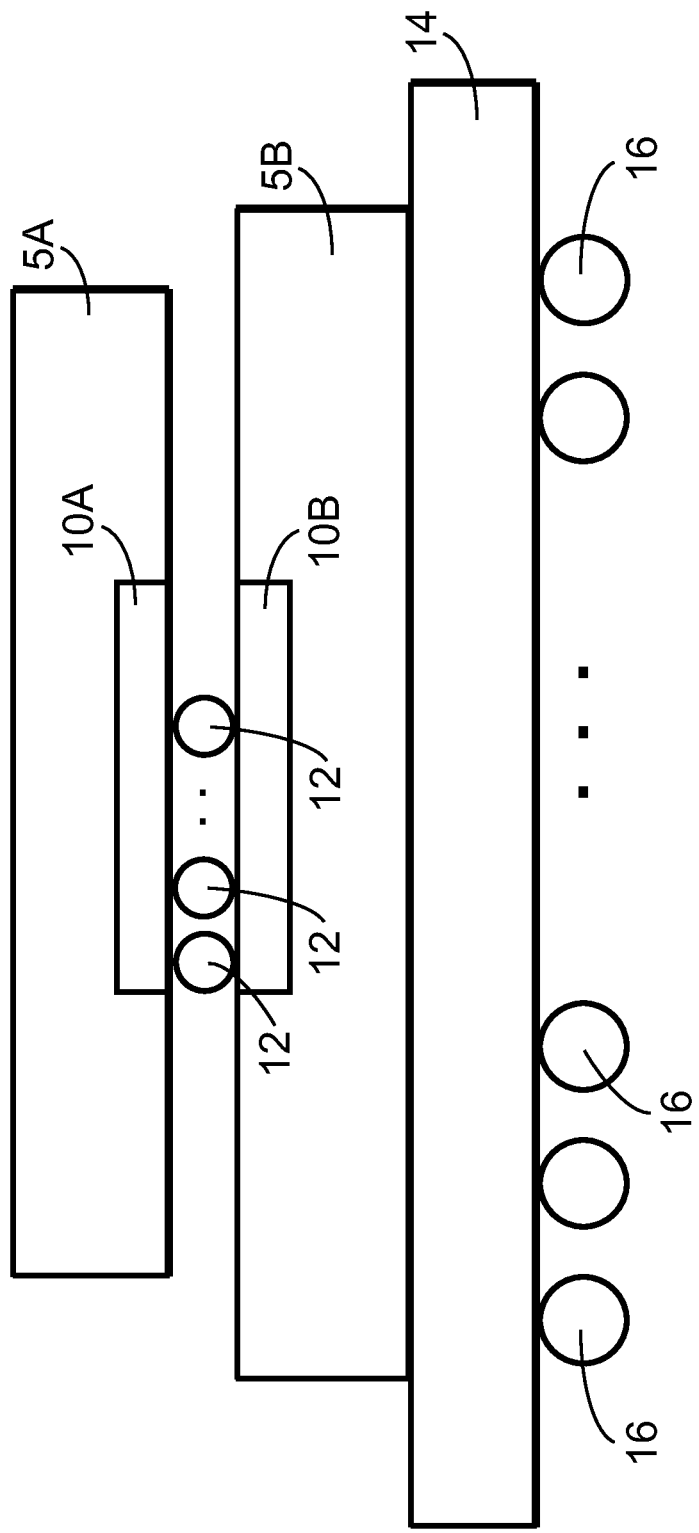
FIG. 1 illustrates an arrangement of semiconductor die that use flexible interface circuitry according to an exemplary embodiment.

FIG. 1 illustrates an arrangement of semiconductor die that use flexible interface circuitry according to an exemplary embodiment. The exemplary arrangement shown includes two semiconductor die, labeled 5A and 5B, stacked or positioned above a substrate or base 14. Rather than two semiconductor die, other numbers of semiconductor die may be used and stacked vertically, as persons of ordinary skill in the art understand. Interconnect 16 (e.g., solder balls or bumps) provide a way for substrate 14 to couple to another medium, such as a printed circuit board (not shown).

Die 5A includes at least one flexible interface circuit or block 10A. Flexible interface block 10A couples to circuitry integrated in die 5A. The circuitry in die 5A may have a variety of forms and provide a variety of desired or specified functionality. For example, the circuitry in die 5A may include digital circuitry (gates, latches, flip-flops, registers, finite state machines, etc.), analog circuitry (amplifiers, adders, current and voltage sources, etc.), mixed-signal circuitry (analog to digital converters (ADCs), digital to analog converters (DACs), etc.), and/or discrete components (transistors, resistors, capacitors, inductors).

Similarly, die 5B includes at least one flexible interface circuit or block 10B. The circuitry in die 5B may have a variety of forms and provide a variety of desired or specified functionality. For example, the circuitry in die 5B may include digital circuitry (gates, latches, flip-flops, registers, finite state machines, etc.), analog circuitry (amplifiers, adders, current and voltage sources, etc.), mixed-signal circuitry (analog to digital converters (ADCs), digital to analog converters (DACs), etc.), and/or discrete components (transistors, resistors, capacitors, inductors).

Flexible interface block 10A couples to flexible interface block 10B via coupling mechanism or interconnect 12 (e.g., solder bumps, solder balls, microbumps, etc.). Interconnect 12 may include signal and power lines, as desired. In addition to providing an electrical coupling mechanism between die 5A and die 5B, interconnect 12 also provides a physical coupling between die 5A and die 5B. In other words, either alone or in conjunction with other structures (not shown), interconnect 12 provide physical support for die 5A.

As noted above, flexible interface block 10A couples to circuitry integrated in die 5A, and flexible interface block 10B couples to circuitry integrated in die 5B. Because flexible interface block 10A couples to flexible interface block 10B, flexible interface blocks 10A-10B provide a mechanism for coupling circuitry integrated in die 5A to circuitry integrated in die 5B.

As persons of ordinary skill in the art understand, the arrangement shown in FIG. 1 illustrates merely one embodiment, and a wide variety of other embodiments are possible and contemplated. Examples include three-dimensional (3D), 2.5D, face-to-face die bonding, face-to-back die bonding, die bonding using through silicon vias (TSVs) in one or more die, etc.

Figure 2:
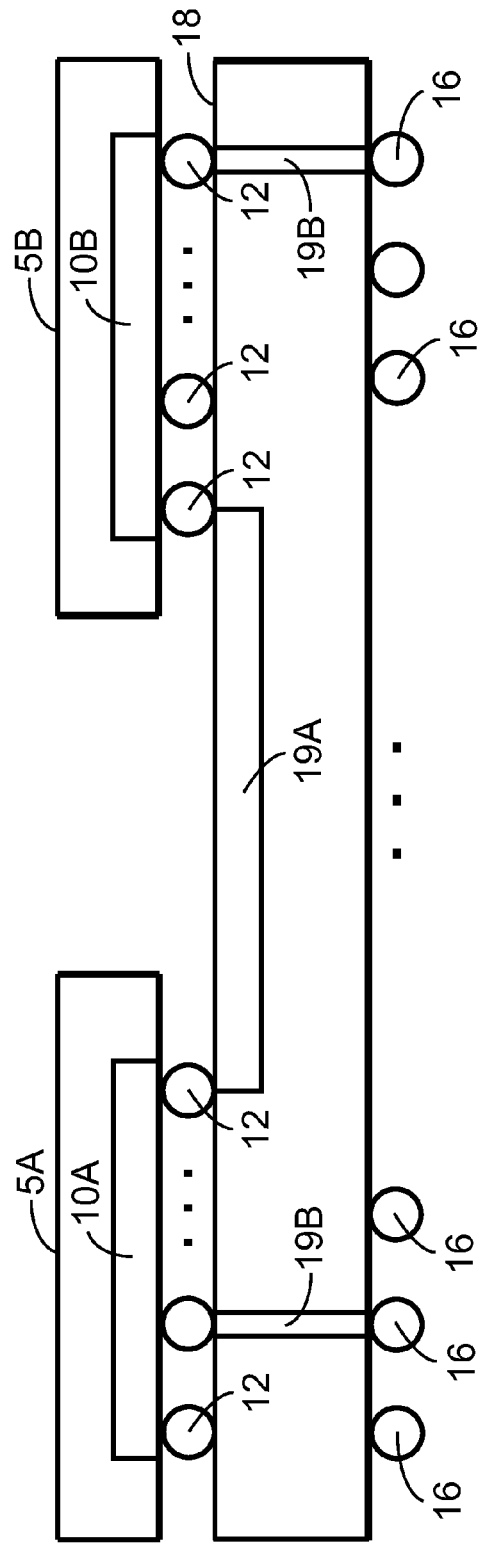
FIG. 2 depicts an arrangement of semiconductor die that use flexible interface circuitry according to another exemplary embodiment.

FIG. 2 depicts an arrangement of semiconductor die that use flexible interface circuitry according to another exemplary embodiment. Similar to the arrangement in FIG. 1, the semiconductor die arrangement of FIG. 2 includes die 5A-5B, flexible interface blocks 10A-10B, interconnect 12, and interconnect 16. In the arrangement in FIG. 2, however, die 5A and 5B are positioned side by side or horizontally, rather than stacked vertically with respect to each other.

Furthermore, the arrangement in FIG. 2 includes an interposer 18. Interposer 18 is positioned below die 5A and die 5B. In other words, die 5A and 5B are positioned above interposer 18, or stacked vertically with respect to interposer 18. Interposer 18 couples to flexible interface blocks 10A-10B via interconnect 12. More specifically, interposer 18 may include a variety of coupling mechanisms that couple flexible interface block 10A to flexible interface block 10B. For example, as persons of ordinary skill in the art understand, the coupling mechanisms of interposer 18 may include one or more conductive traces 19A and one or more TSVs 19B to couple die 5A and 5B to one another (via flexible interface blocks 10A-10B), to circuitry coupled to interposer 18 (via interconnects 16), etc. As a result, interposer 18 provides a path for electrical signals from flexible interface block 10A to flexible interface block 10B, from flexible interface block 10B to flexible interface block 10A, or both. Thus, via interposer 18, flexible interface block 10A and flexible interface block 10B provide a mechanism for circuitry in die 5A to communicate with circuitry in die 5B.

Figure 3:
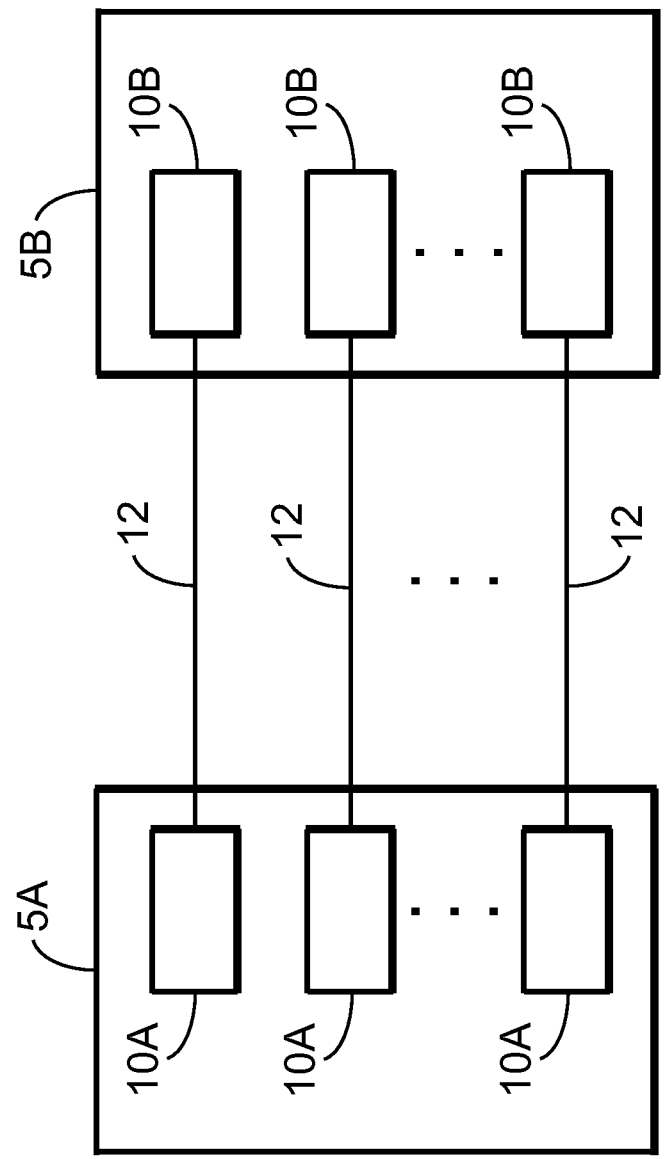
FIG. 3 shows a circuit arrangement according to an exemplary embodiment for coupling together circuitry in semiconductor die by using one or more flexible interface blocks.

The disclosed flexible interface blocks provide a mechanism for two or more die to communicate a desired number of information and power signals. FIG. 3 shows a circuit arrangement according to an exemplary embodiment for coupling together circuitry in semiconductor die by using one or more flexible interface blocks.

Specifically, die 5A includes one or more flexible interface blocks 10A. Similarly, die 5B includes one or more flexible interface blocks 10B. Flexible interface blocks 10A couple to flexible interface blocks 10B via interconnect 12. In exemplary embodiments, flexible interface blocks 10 may have a desired number of data paths (as exemplified by interconnect 12). By using one or more flexible interface blocks 10A and 10B, one may provide a desired number of information and power paths between semiconductor die 5A and 5B.

As an example, suppose that each of flexible interface blocks 10A and 10B includes 50 data/power paths (as exemplified by interconnect 12, i.e., 50 coupling mechanisms in this example). Suppose further that one desires 200 data/power paths between die 5A and die 5B, one would include four flexible interface blocks 10A in die 5A, and four flexible interface blocks 10B in die 5B. Generally, the arrangement described can accommodate a variety of designs and specifications for the number of data/power paths between die 5A and die 5B, as persons of ordinary skill in the art understand. Thus, flexible interface blocks 10A-10B provide a scalable and flexible mechanism for coupling a desired number of data/power lines in the circuitry of die 5A to corresponding data/power lines to the circuitry in die 5B.

Figure 4:
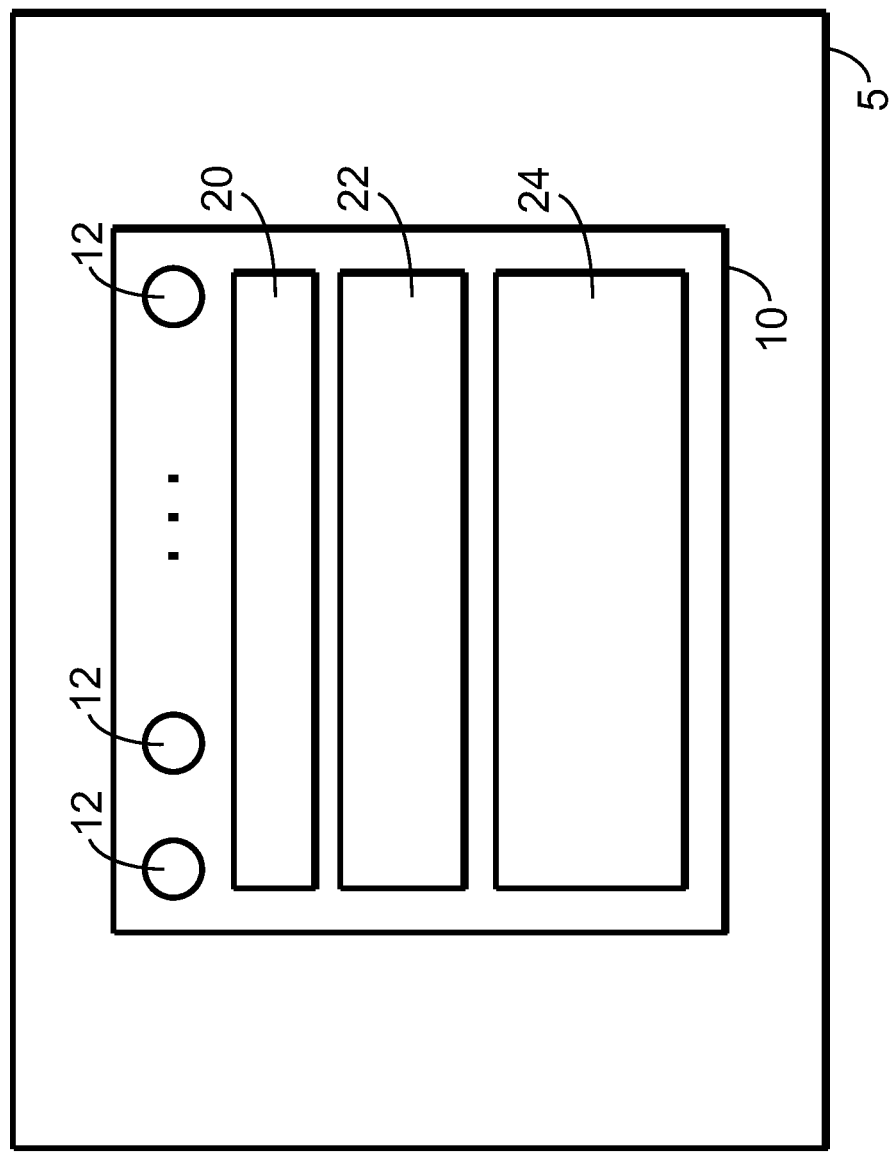
FIG. 4 depicts a block diagram of a flexible interface block according to an exemplary embodiment.

FIG. 4 depicts a block diagram of a flexible interface block 10, included in semiconductor die 5, according to an exemplary embodiment. As described above, flexible interface block 10 includes a desired number of interconnect 12. In the embodiment shown, flexible interface block 10 further includes buffer circuitry 20, controller 22, and routing interface 24.

Interconnect 12, as noted above, may include a variety of mechanisms or features. For example, in some embodiments, interconnect 12 may constitute microbumps. The microbumps may have a desired pitch or spacing, for example, 45 to 50 microns. Interconnect 12 may be unidirectional or bidirectional, i.e., provide communication in one direction or in both directions between semiconductor die. As noted above, the number and/or type of interconnect 12 depends on a number of factors related to a specific implementation or design, as persons of ordinary skill in the art understand. Examples of such factors include desired data bandwidth, desired number of data signals, desired number of power paths, etc.

As noted, interconnect 12 communicate a variety of signals between semiconductor die. Without limitation, interconnect 12 may communicate data, power, control signals, status signals between semiconductor die. By using desired types and numbers of signals, flexible and powerful interfaces may be accommodated between semiconductor die.

Buffer circuitry 20 couples to some (e.g., all data signals) or all (e.g., a mixture of data and power lines) interconnect 12. Buffer circuitry 20 may provide one or more of the following functions in exemplary embodiments. First, buffer circuitry 20 may provide output buffer functionality by buffering, level-shifting (e.g., to accommodate differing voltage levels of the signal source and destination circuits), and/or conditioning signals from circuitry in die 5 in order to provide or transmit those signals to circuitry in another die (not shown). Second, buffer circuitry 20 may provide input buffer functionality by buffering, level-shifting (e.g., to accommodate differing voltage levels of the signal source and destination circuits), and/or conditioning signals from another die (not shown) in order to provide those signals to circuitry in die 5. Furthermore, buffer circuitry 20 may provide bi-directional buffer functionality by buffering, level-shifting (e.g., to accommodate differing voltage levels of the signal source and destination circuits), and/or conditioning signals from circuitry in die 5 in order to provide or transmit those signals to circuitry in another die (not shown), and vice-versa.

In exemplary embodiments, buffer circuitry 20 may have various programmable or configurable features to provide flexibility. For example, in some embodiments, buffer circuitry 20 may have tristate functionality. As another example, buffer circuitry 20 may have fixed or programmable drive strength and/or slew rate.

Controller 22 couples to buffer circuitry 20. Generally, controller 22 provides control and supervisory functions of flexible interface block 10. For example, controller 22 may determine the timing, direction, and number of signals communicated between die. Thus, under the control of controller 22, data/power signals are provided to buffer circuitry for ultimate communication to another semiconductor die.

Controller 22 may support one or more data or communication protocols. For example, suppose that a processor in one semiconductor die seeks to communicate with a memory in another semiconductor die. Suppose further that the memory uses a DDR protocol, well known to persons of ordinary skill in the art. Controller 22 may include circuitry to support communication between the processor and the memory according to the DDR protocol. Generally, controller 22 may support any desired protocol, for example, DDR, DDR2, DDR3, communication protocols, signaling protocols, etc.

Routing interface 24 couples to controller 22 and to circuitry (other than flexible interface block 10) in die 5. Specifically, routing interface 24 accepts data/power signals from circuitry (not shown explicitly) in die 5 and provides such signals to controller 22. Conversely, routing interface 24 may receive data/power signals from controller 22 (e.g., as ultimately received from circuitry in another semiconductor die (not shown explicitly)), and provides such signals to circuitry (not shown explicitly) in die 5.

Figure 5:
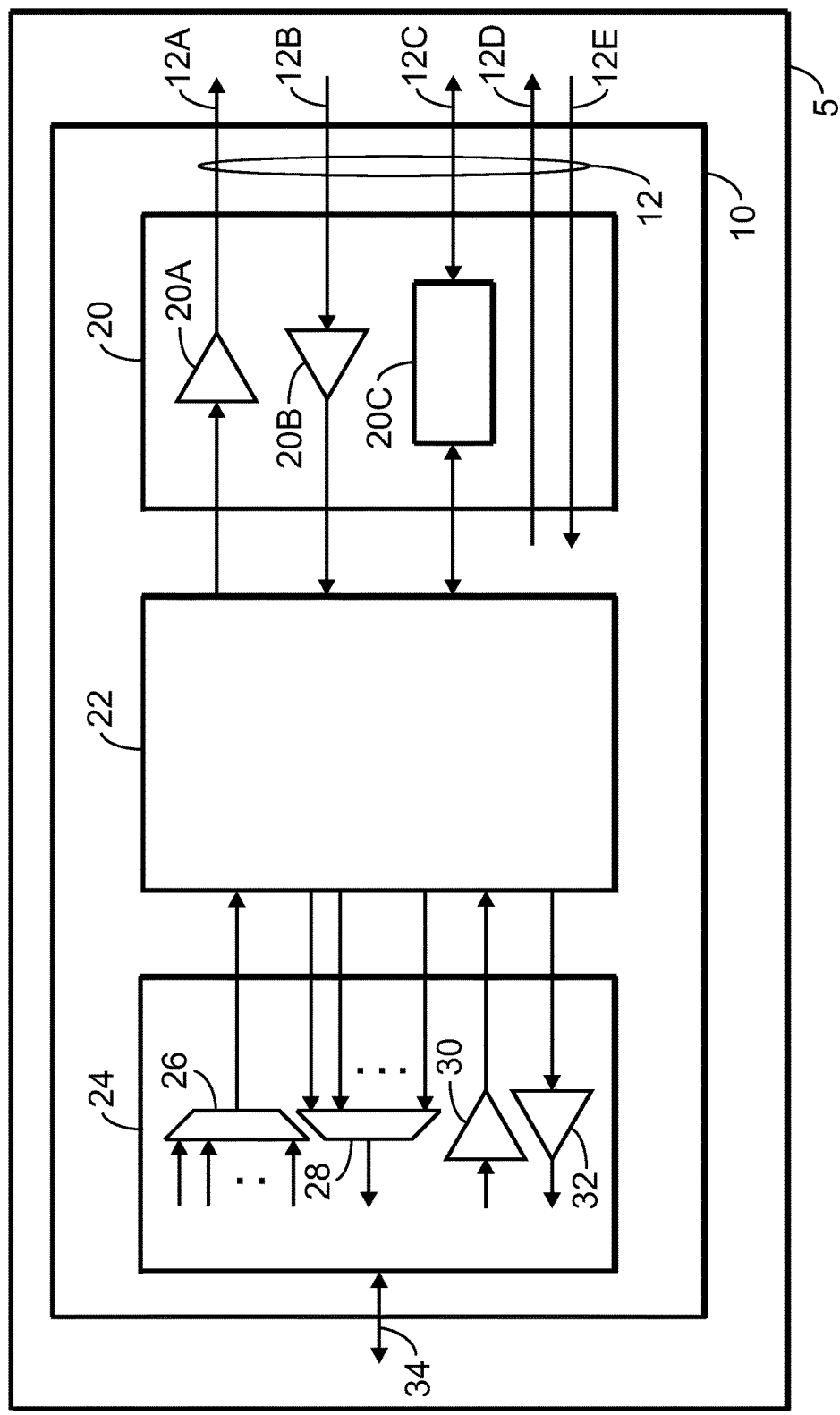
FIG. 5 illustrates more details of a flexible interface block according to an exemplary embodiment.

FIG. 5 illustrates more details of a flexible interface block 10 according to an exemplary embodiment. In the embodiment shown, interconnect 12 includes a unidirectional output line (or link or interconnect) 12A, a unidirectional input line 12B, and a bidirectional line 12C. Furthermore, interconnect 12 includes power line 12D for supplying power to another device, and power line 12E for receiving power from another device.

Buffer circuitry 20 includes an output buffer 20A, which feeds output line 12A of interconnect 12. Buffer circuitry 20 also includes an input buffer 20B, which is fed by input line 12B. Furthermore, buffer circuitry 20 includes bidirectional buffer 20C, which couples to line 12C for transmitting or receiving signals. Note that buffer circuitry 20, as shown, does not include circuitry for power lines 12D-12E, and passes the power through buffer circuitry 20. In other embodiments, however, buffer circuitry 20 may include circuitry for conditioning or regulating power, as desired.

In exemplary embodiments, controller 22 may include a variety of circuitry, ranging from hardened (fixed or non-programmable) to soft (fully programmable) or customizable circuitry. Thus, in some embodiments, controller 22 may include logic gates, registers, flip-flops, counters, finite state machines, hardened intellectual property (IP), memory, multiplexers (MUXs), latches, and the like. In some embodiments, controller 22 may include fully customizable or programmable logic, such as look-up tables (LUTs), soft IP, and generally circuitry similar to the programmable fabric of a programmable logic device (PLD). In yet other embodiments, controller 22 may include structured application specific IC (structured ASIC) circuitry. In such embodiments, with one or more mask changes, the functionality of controller 22 may be configured, customized, or programmed, as persons of ordinary skill in the art understand. Regardless of the exact implementation, in some embodiments, controller 22 in two or more flexible interface blocks 10 may be combined to provide additional flexibility, increased functionality, etc.

Generally speaking, routing interface 24 provides a mechanism for circuitry (not shown explicitly) in die 5 to communicate with controller 22 and, ultimately, with circuitry in another die (not shown explicitly). Routing interface 24 may include MUXs, buffers, registers, and similar circuitry. For example, in the embodiment shown, MUX 26 (under the control of controller 22, for example) may select one of several signals received from circuitry (not shown explicitly) within die 5 (e.g., through link 34), and provide the selected signal to controller 22. As another example, MUX 28 (under the control of controller 22, for example) may select one of several signals received from controller 22, and provide the selected signal to circuitry (not shown explicitly) within die 5 (e.g., through link 34).

Buffer or driver 30 may receive as an input a signal from routing interface 24 (e.g., a signal received via link 34 from circuitry (not shown explicitly) in die 5), and provide an output signal to controller 22. Conversely, buffer or driver 32 may receive as an input a signal from controller 22, and provide an output signal to routing interface 24. Routing interface 24 may provide the buffered signal to circuitry (not shown explicitly) in die 5 via link 34.

In some embodiments, routing interface 24 may include circuitry similar to the programmable interconnect of a PLD. In such embodiments, the functionality of the circuitry in routing interface 24 may be programmed or configured, much in the same way as the routing fabric or resources of a PLD.

The embodiments described above include a variety of circuitry and functionality for flexible interface blocks 10. In some embodiments, all of the features may be used. As persons of ordinary skill in the art understand, in some embodiments, one or more of the described features may be used. In other words, the circuitry and functionality included in one or more flexible interface blocks 10 depends on the specifications for a given design or implementation. Flexible interface blocks 10 can accommodate relatively simple to relatively complex interfacing specifications.

Figure 6:
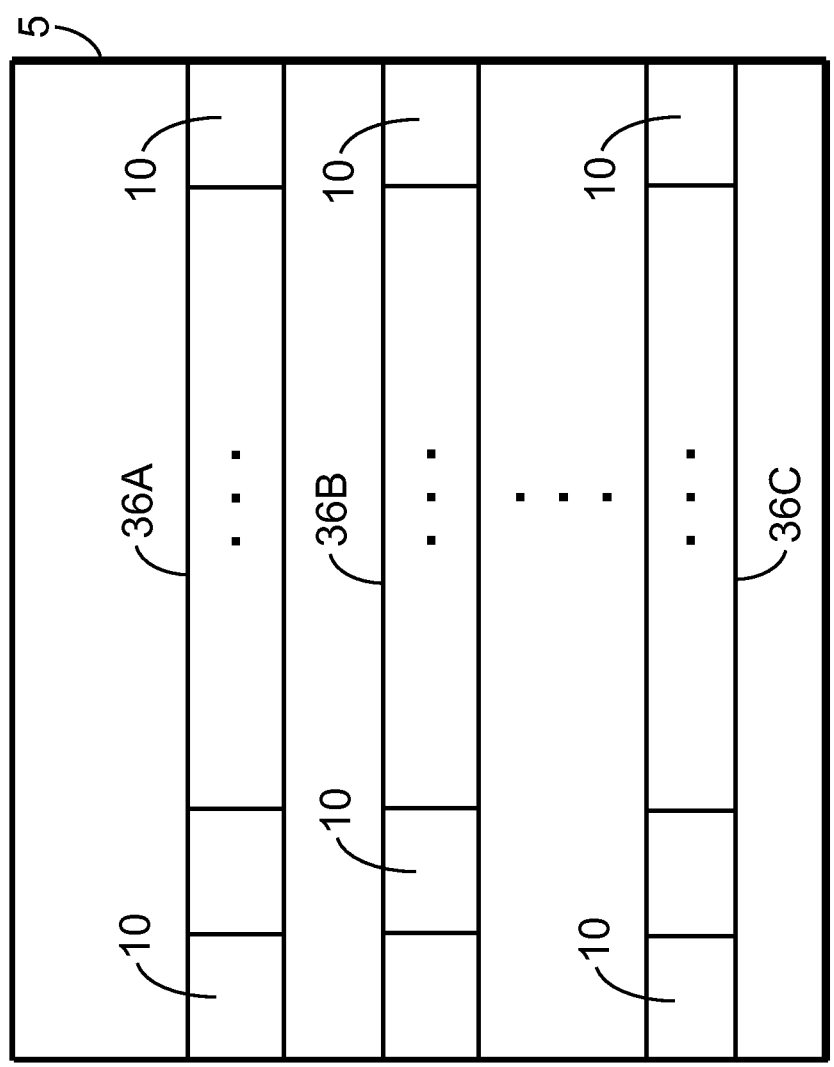
FIG. 6 depicts an arrangement of flexible interface blocks in a semiconductor die according to an exemplary embodiment.

According to another aspect of the disclosure, flexible interface blocks 10 within a semiconductor die 5 may be grouped or arranged in a variety of ways. For example, in some embodiments, flexible interface blocks 10 within a semiconductor die 5 may be arranged as rows of flexible interface blocks. FIG. 6 shows such an arrangement. Specifically, die 5 includes a plurality of rows 36A-36C of flexible interface blocks 10. Rows 36A-36C may include one or more flexible interface blocks 10.

Figure 7:
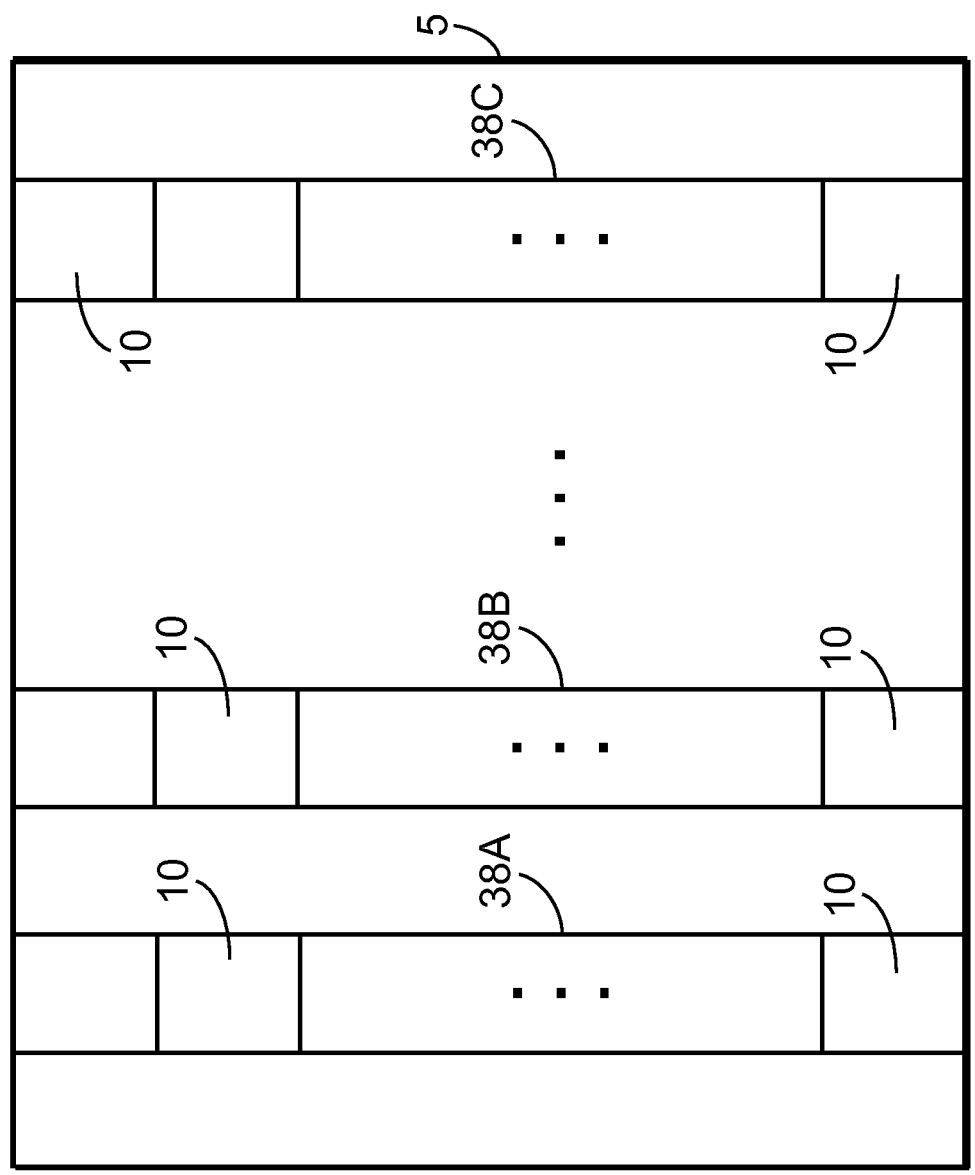
FIG. 7 illustrates an arrangement of flexible interface blocks in a semiconductor die according to another exemplary embodiment.

As another example, in some embodiments, flexible interface blocks 10 within a semiconductor die 5 may be arranged as columns of flexible interface blocks. FIG. 7 illustrates such an arrangement. Referring to FIG. 7, die 5 includes a plurality of columns 38A-38C of flexible interface blocks 10. Columns 38A-38C may include one or more flexible interface blocks 10.

Figure 8:
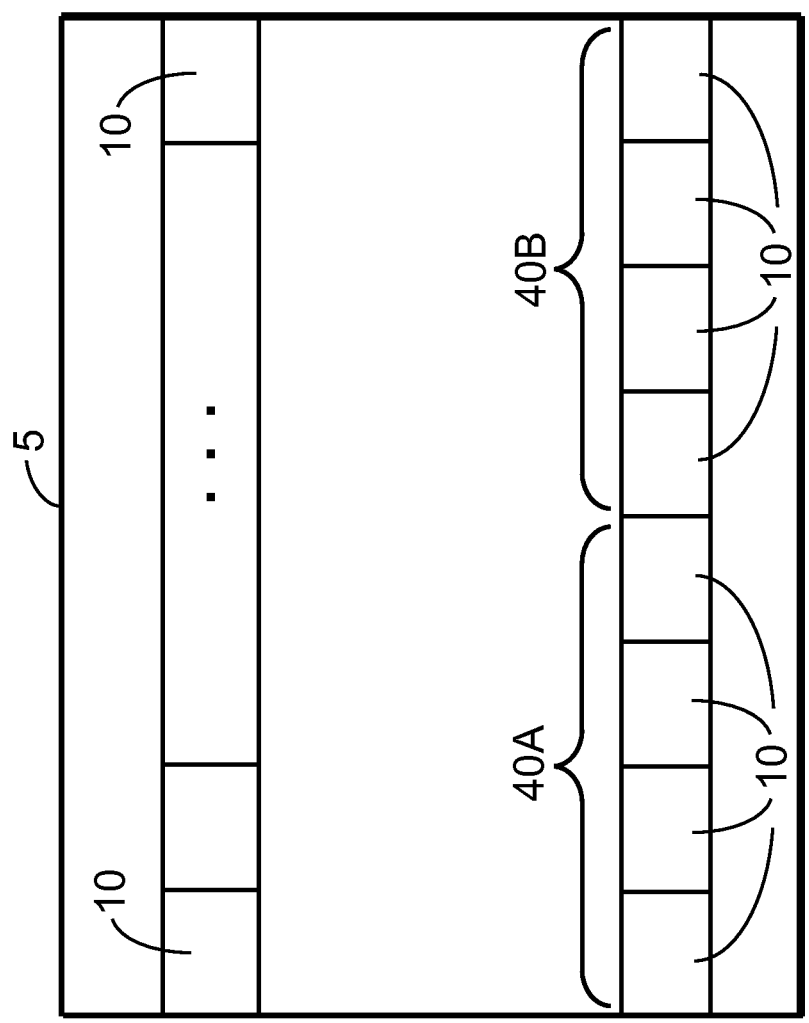
FIG. 8 shows grouping of flexible interface blocks in a semiconductor die according to an exemplary embodiment.

In some embodiments, two or more flexible interface blocks 10 may be grouped together, for example, to provide additional data/power lines, wider data paths, more flexible or powerful controllers 22, etc. FIG. 8 depicts an example of such embodiments. Die 5 includes a plurality of flexible interface blocks 10. Flexible interface blocks 10 may be arranged in a number of ways, for example, in rows, in columns, individually positioned at desired locations, etc. Where two or more flexible interface blocks 10 neighbor each other or are positioned next to each other or relatively close to each other, they may be combined together to provide additional functionality or flexibility, as noted above. In the embodiment shown, four flexible interface blocks 10 are grouped together to form a group 40A of flexible interface blocks 10, and another four flexible interface blocks 10 are grouped together as group 40B of flexible interface blocks 10.

Figure 9:
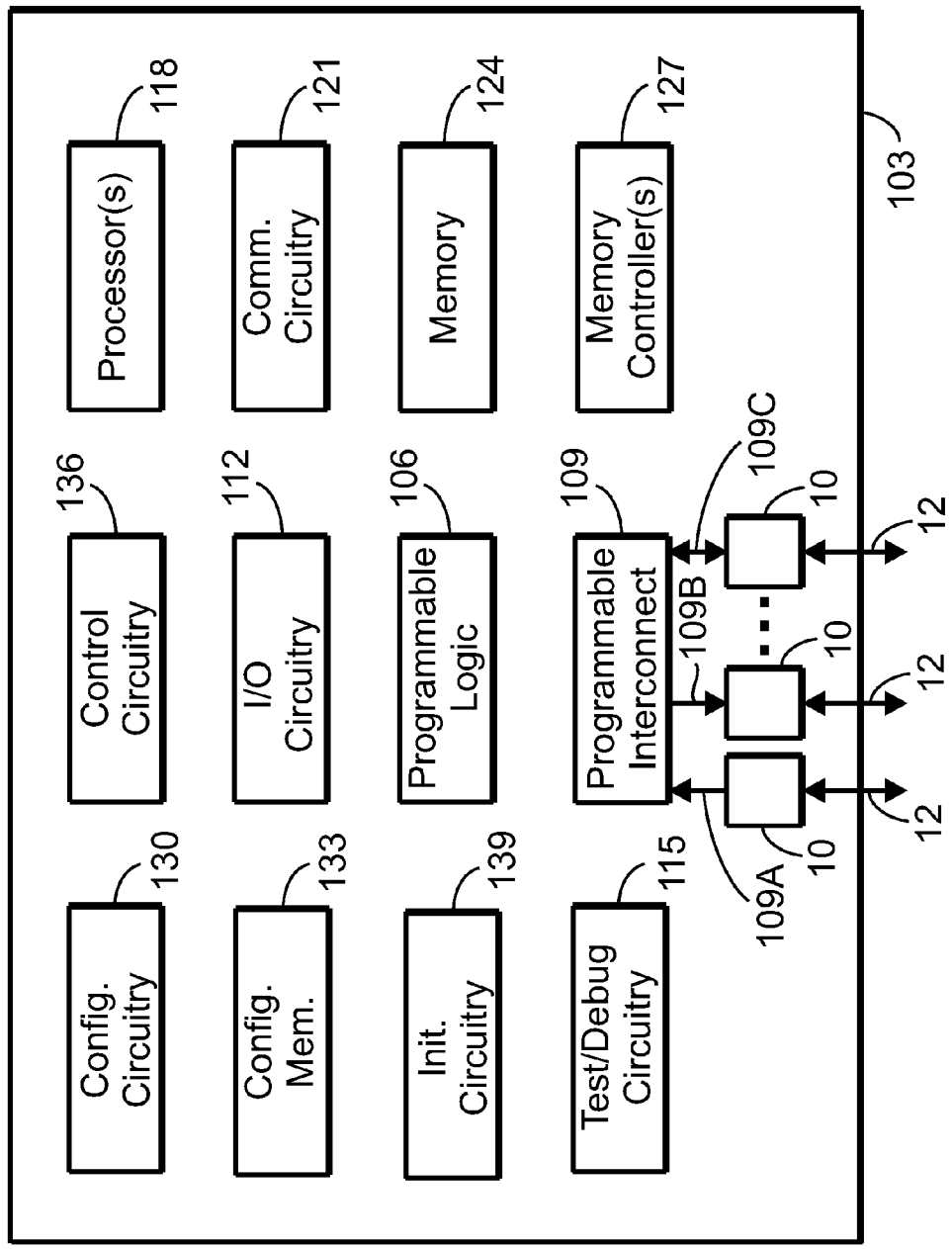
FIG. 9 illustrates a general block diagram of a programmable logic device (PLD) that includes one or more flexible interface blocks.

One may apply the disclosed concepts to a wide variety of ICs, including ICs that include fully or partially programmable or configurable circuitry. Thus, in some embodiments, a PLD integrated in one semiconductor die may include one or more flexible interface blocks 10 in order to couple to or interface to circuitry integrated in one or more additional semiconductor die. Note that in some embodiments, a PLD integrated in one semiconductor die may include one or more flexible interface blocks 10 in order to couple to or interface to one or more PLDs integrated in one or more additional semiconductor die Without a loss of generality, the following paragraphs describe the application of disclosed concepts to PLDs. FIG. 9 depicts a general block diagram of a PLD 103 according to an exemplary embodiment that includes one or more flexible interface blocks 10. PLD 103 may be included or fabricated in a semiconductor die, such as those described above and shown in FIGS. 1-8.

Referring to FIG. 9, PLD 103 includes configuration circuitry 130, configuration memory (CRAM) 133, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, one or more flexible interface blocks 10, and initialization circuit 139, as desired.

Note that PLD 103 may include other blocks and circuitry, as persons of ordinary skill in the art understand. Examples of such circuitry include clock generation and distribution circuits, redundancy circuits, and the like. Furthermore, PLD 103 may include analog circuitry, other digital circuitry, and/or mixed-signal circuitry, as desired.

Programmable logic 106 includes blocks of configurable or programmable logic circuitry, such as LUTs, product-term logic, MUXs, logic gates, registers, memory, and the like. Programmable interconnect 109 couples to programmable logic 106 and provides configurable interconnects (coupling mechanisms) between various blocks within programmable logic 106 and other circuitry within or outside PLD 103. Programmable interconnect 109 may include MUXs, pass transistors, buffers, and the like, as persons of ordinary skill in the art understand.

Control circuitry 136 controls various operations within PLD 103. Under the supervision of control circuitry 136, PLD configuration circuitry 130 uses configuration data (which it may obtain from an external source, such as a storage device, a host, etc.) to program or configure the functionality of PLD 103. Configuration data are typically stored in CRAM 133. The contents of CRAM 133 determine the functionality of various blocks of PLD 103, such as programmable logic 106 and programmable interconnect 109. Initialization circuit 139 may cause the performance of various functions at reset or power-up of PLD 103.

I/O circuitry 112 may constitute a wide variety of I/O devices or circuits, as persons of ordinary skill in the art who have the benefit of the disclosure understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the disclosure. For example, test/debug circuitry 115 may include circuits for performing tests after PLD 103 powers up or resets, as desired. Test/debug circuitry 115 may also include coding and parity circuits, as desired.

PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the disclosure in this document appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may also include one or more communication circuits 121. Communication circuit(s) 121 may facilitate data and information exchange between various circuits within PLD 103 and circuits external to PLD 103, as persons of ordinary skill in the art understand. For example, in some embodiments, communication circuitry 121 may include transceivers for communicating with other electronic devices.

PLD 103 may further include one or more memories 124 and one or more memory controller(s) 127. Memory 124 allows the storage of various data and information (such as user-data, intermediate results, calculation results, etc.) within PLD 103. Memory 124 may have a granular or block form, as desired. Memory controller 127 allows interfacing to, and controlling the operation and various functions of memory 124 and/or memory external to PLD 103 and/or die 5 (e.g., memory integrated in another semiconductor die (not shown)). For example, controller 127 may constitute a memory controller that interfaces to and controls an external (e.g., memory integrated in another semiconductor die (not shown)) synchronous dynamic random access memory (SDRAM), as desired.

Flexible interface blocks 10 may include the circuitry, and provide the functionality, described above. Flexible interface blocks 10 couple to programmable interconnect 109. Programmable interconnect 109 may in turn couple to one or more blocks of circuitry in PLD 103, such as the blocks shown in the figure. Such blocks may communicate with flexible interface blocks 10 via programmable interconnect 109. Furthermore, flexible interface blocks 10 may communicate with circuitry within another semiconductor die (not shown) via interconnect 12.

Figure 10:
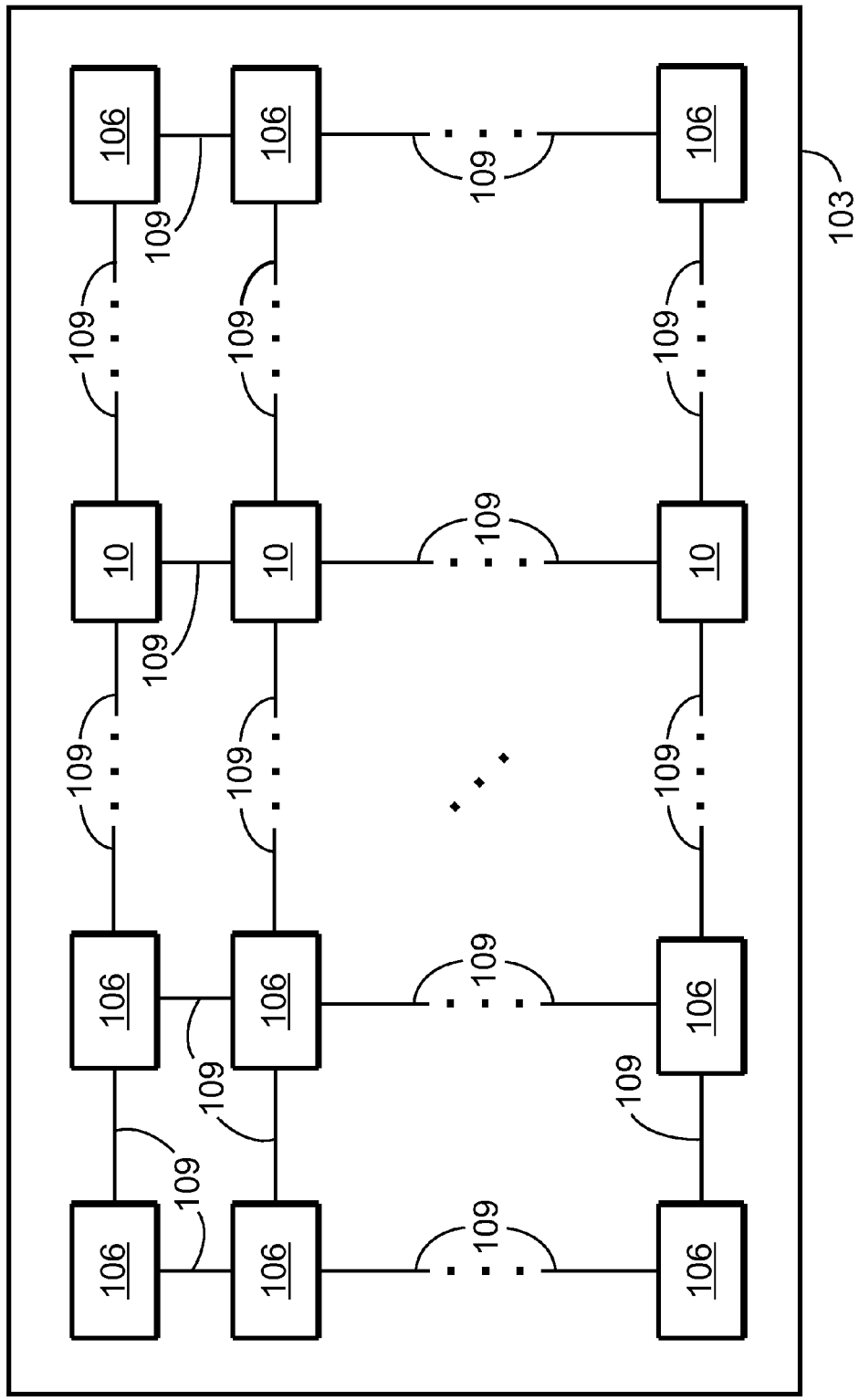
FIG. 10 depicts a block diagram of a PLD that includes programmable resources and flexible interface blocks according to an exemplary embodiment.

FIG. 10 shows a block diagram of a PLD 103 that includes programmable resources and flexible interface blocks according to an exemplary embodiment. More specifically, the figure shows a floor-plan of a PLD that 103 includes programmable logic 106 arranged as a two-dimensional array. Programmable interconnect 109, arranged as horizontal interconnect and vertical interconnect, couples the blocks of programmable logic 106 to one another.

PLD 103 includes flexible interface blocks 10, which may be arranged as a row, a column, or in a two-dimensional or array pattern. Flexible interface blocks 10 couple to one or more blocks in PLD 103 via programmable interconnect 109. As noted above, two or more flexible interface blocks 10 may be grouped together to provide increased bandwidth, throughput, functionality, etc. Such groups of flexible interface blocks may couple to programmable logic 106 or other blocks of circuitry in PLD 103 (see, e.g., FIG. 9) via programmable interconnect.

One may place the various blocks in FIG. 10 a particular manner so as to implement a user's design, as persons of ordinary skill in the art understand. A block, part of a block, or a set of blocks may constitute a tile or region of PLD 103. PLD 103 may thus include a number of tiles, arranged in a desired configuration (e.g., as two halves, four quadrants, etc.), as persons of ordinary skill in the art understand. In other embodiments, PLD 103 may include rows and/or columns of circuitry or blocks of circuitry.

Flexible interface blocks 10 may advantageously be used at a more granular level in PLDs. Specifically, in some embodiments, the core or fabric of PLD 103 may include a more granular structure of programmable circuitry (e.g., programmable logic, programmable interconnect, etc.). Flexible interface blocks 10 may be used in such embodiments to provide a flexible, customizable interface at a desired level of granularity in PLD 103.

Figure 11:
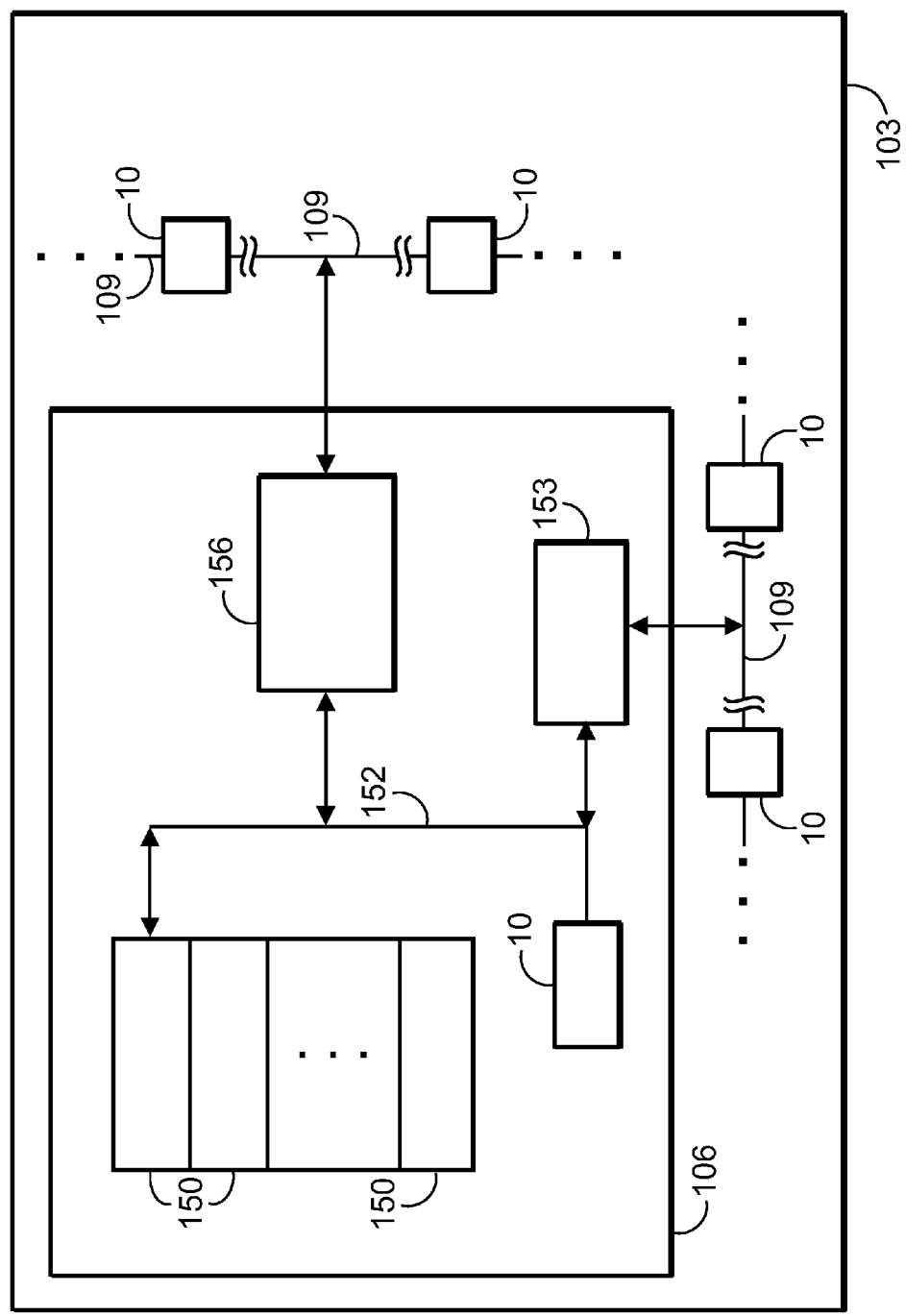
FIG. 11 shows a block diagram of a PLD that includes programmable resources and flexible interface blocks according to another exemplary embodiment.

FIG. 11 shows a circuit arrangement of blocks of programmable logic 106 coupled to flexible interface blocks 10 via programmable interconnect 109 according to an exemplary embodiment. In the exemplary embodiment shown, programmable logic 106 includes logic elements or programmable logic elements, circuits, or blocks 150, local interconnect 152, interface circuit 153, and interface circuit 156. Flexible interface blocks may couple to programmable logic 106 at a lower level than the global PLD resource level, at the global PLD resource level, or both.

Logic elements 150 provide configurable or programmable logic functions, for example, LUTs, flip-flops, registers, product-term logic, etc., as persons of ordinary skill in the art understand. Local interconnect 152 provides a configurable or programmable mechanism for logic elements 150 to couple to one another. In addition, local interconnect 152 provides a configurable or programmable mechanism for logic elements 150 to one or more flexible interface blocks 10.

Logic elements 150 may couple to one another, to one or more flexible interface blocks 10, or to programmable interconnect 109 (sometimes called "global interconnect"), as desired. Interface circuit 156 and interface circuit 153 provide a configurable or programmable way for programmable logic 106 block of circuitry to couple to programmable interconnect 109 (and hence to other programmable logic 106).

Interface circuit 156 and interface circuit 153 may include MUXs, DEMUXs, registers, buffers, pass gates, drivers, and the like, as persons of ordinary skill in the art understand. At a higher level, one may combine a number of logic elements 150 and associated circuitry to realize a larger programmable block. One may repeat this process as desired or appropriate in a given situation to generate programmable blocks of circuitry with a desired level of granularity of programmability. At one or more of such levels, the hierarchical structure or fabric or circuitry of PLD 103 may be coupled to one or more flexible interface blocks 10, which may be arranged in a number of ways (e.g., as individual blocks, rows, columns, two-dimensional arrays).

Once a desired number of flexible interface blocks 10 have been included in a PLD 103, the programmable nature of the PLD, together with flexible interface blocks 10, provides the user with a scalable, flexible architecture for realizing or implementing a wide variety of electronic circuitry or systems with desired functionality. To aid the user in implementing or realizing such circuitry or systems, one may use a computer-aided design (CAD) flow or software.

Figure 12:
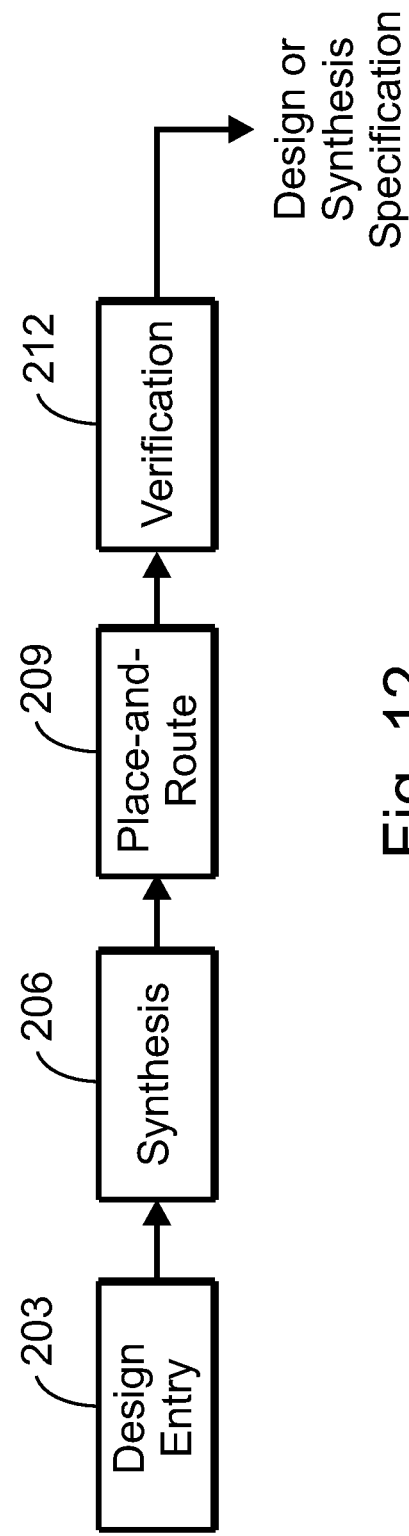
FIG. 12 illustrates a block diagram of various modules of a PLD computer-aided design (CAD) software or flow according to an exemplary embodiment.

FIG. 12 illustrates various software modules that PLD CAD software or flow according to an exemplary embodiments uses. The modules include design-entry module 203, synthesis module 206, place-and-route module 209, and verification module 212. The CAD flow may have a variety of applications and provide various functionality. Examples include design area optimization or planning, placement, timing performance and closure, power planning, routability optimization or planning, etc.

Design-entry module 203 allows the editing of various design description files using graphical or textual descriptions of a circuit or its behavior, such as schematics, hardware description languages (HDL), or waveforms, as desired. The user may generate the design files by using design-entry module 203 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

The user may specify one or more flexible interface block 10 as part of the specification of the overall PLD. By using flexible interface blocks 10, the user's circuit may couple to other circuitry integrated in one or more semiconductor die, as described above. The user may provide a variety of specifications for flexible interface block 10. Example include location (placement specifications), power specifications, timing specifications, functionality, etc. The user may also group two or more flexible interface blocks 10, as described above.

In some embodiments, the CAD flow may logically treat flexible interface blocks 10 and the circuitry to which they couple as blocks of circuitry or IP of PLD 103. Thus, although such flexible interface blocks 10 may physically interface to circuitry integrated in a different die than that of PLD 103, for the purpose of analyzing, synthesizing, and placing the user's circuit, the CAD flow may consider such circuitry as being a part of the circuitry of PLD 103, and located at the location(s) of flexible interface block(s) 10. In other words, flexible interface blocks 10 and associated circuitry (e.g., a memory block integrated in a different die than that of PLD 103) may be represented or treated as an embedded memory block in PLD 103. Thus, in this example, the memory block may be represented or modeled (e.g., logically) as flexible interface blocks 10 coupled to the memory block.

By using a more abstract object, for example, a macro, the various physical, electrical, and logical attributes of flexible interface block(s) 10 and the circuitry external to PLD 103 (e.g., integrated in a different die than the die of PLD 103) may be attributed to the abstract object. In this manner, a 3D structure (e.g., one die stacked above another die, either or both of which may be a PLD) may be represented to the user as a two-dimensional (2D) structure. Thus, the CAD flow will handle the complexities associated with the physical structure, with the logical structure, the electrical structure, etc. (timing, electrical interface, voltage levels, and the like). As a result, the complexities associated with the 3D structure may be hidden or made transparent to the user of the PLD (or PLD CAD) by representing the 3D structure as a 2D structure. As persons of ordinary skill in the art understand, this concept is not limited to memory blocks, and may be applied to a wide variety of circuitry and IP blocks, as desired.

For example, suppose that the user wants to use a memory block to implement his or her circuit. The CAD flow may include representations of the memory block that specify the memory block as integrated in a different die than the die of PLD 103, where the die that includes the memory block couples to PLD 103 via one or more flexible interface blocks 10, at location X in the floorplan of PLD 103. From the perspective of the user, the memory block is a macro that he or she may use as part of the design specifications. The PLD CAD flow, using the location specifications, and electrical (timing, signals, controller design, protocol, etc.), physical (e.g., different die), and logical attributes (width, depth, etc.) of the memory block, properly represents the memory block in the user's design.

Synthesis module 206 accepts the output of design-entry module 203. Based on the user-provided design, synthesis module 206 generates appropriate logic circuitry that realizes the user-provided design. One or more PLDs (not shown explicitly), such as PLD 103 in FIG. 1, implement the synthesized overall design or system.

Synthesis module 206 may also generate any glue logic that allows integration and proper operation and interfacing of various modules in the user's designs. For example, synthesis module 206 provides appropriate hardware so that an output of one block properly interfaces with an input of another block. Synthesis module 206 may provide appropriate hardware so as to meet the specifications of each of the modules in the overall design or system. If the user's design includes abstract objects or circuitry or components, such as circuitry coupled to PLD 103 via flexible interface block(s) 10, the synthesis module represents the object in the user's design using the attributes of the object.

Furthermore, synthesis module 206 may include algorithms and routines for optimizing the synthesized design. Through optimization, synthesis module 206 seeks to more efficiently use the resources of the one or more PLDs that implement the overall design or system. Synthesis module 206 provides its output to place-and-route module 209. Following synthesis, one may include a technology mapping module (not shown explicitly).

Place-and-route module 209 uses the designer's timing specifications to perform optimal logic mapping and placement in the floorplan of PLD 103. The logic mapping and placement determine the use of logic resources within the PLD(s). By the use of particular programmable interconnects with the PLD(s) for certain parts of the design, place-and-route module 209 helps optimize the performance of the overall design or system. By the proper use of PLD routing resources, place-and-route module 209 helps to meet the critical timing paths of the overall design or system. As noted above, flexible interface block(s) 10 may have predetermined, pre-assigned, reserved, or allocated locations in the floorplan of PLD 103. Place-and-route module 209 uses information about such locations to properly route other components or circuitry to flexible interface block(s) 10 and, hence, to other circuitry integrated in different die than the die of PLD 103.

Place-and-route module 209 optimizes the critical timing paths to help provide timing closure faster, as persons of ordinary skill in the art understand. As a result, the overall design or system can achieve faster performance (i.e., operate at a higher clock rate or have higher throughput).

Verification module 212 performs simulation and verification of the design. The simulation and verification seek in part to verify that the design complies with the user's prescribed specifications. The simulation and verification also aim at detecting and correcting any design problems before prototyping the design. Thus, verification module 212 helps the user to reduce the overall cost and time-to-market of the overall design or system.

Verification module 212 may support and perform a variety of verification and simulation options, as desired. The options may include functional verification, test-bench generation, static timing analysis, timing simulation, hardware/software simulation, in-system verification, board-level timing analysis, signal integrity analysis and electromagnetic compatibility (EMC), formal netlist verification, and the like, as persons of ordinary skill in the art who have the benefit of the description of this disclosure understand.

Note that one may perform other or additional verification techniques as desired and as persons of ordinary skill in the art who have the benefit of this disclosure understand. Verification of the design may also be performed at other phases in the flow, as appropriate, and as desired.

As noted above, although the above description relates in part the application of the disclosed concepts to PLDs, one may apply the disclosed concepts to a variety of other electronic circuits and devices, by making modifications that fall within the knowledge of persons of ordinary skill in the art. Some examples of such devices include custom, standard-cell, gate-array, field-programmable gate arrays (FPGAs), complex PLDs (CPLDs), and structured ASIC implementations.

Figure 13:
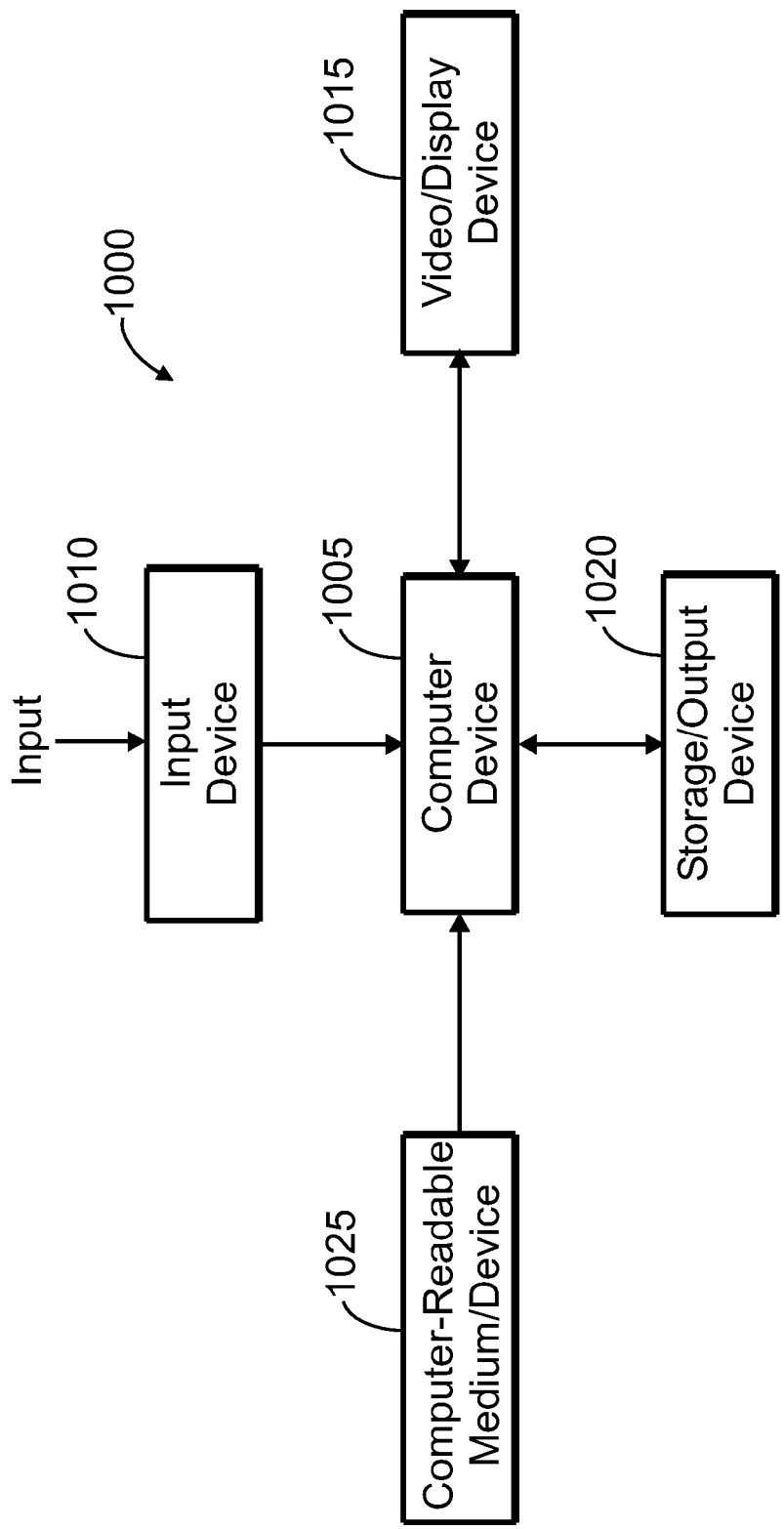
FIG. 13 depicts a block diagram of a system for processing information, such as a CAD flow, according to an exemplary embodiment.

One may run or execute the disclosed algorithms, methods, software (e.g., CAD software), or firmware (e.g., where part of the functionality of some circuitry, such as body bias control circuitry, is implemented using firmware) on computer systems or processors. Specifically, the PLD CAD flow may be implemented as software that runs on an information processing system or computer, such as the information processing system shown in FIG. 13. Persons of ordinary skill in the art understand that one may use a wide variety of other information processing apparatus, computer systems, processors, microcomputers, workstations, and the like, as desired. Thus, FIG. 13 illustrates merely one example.

System 1000 includes a computer device 1005, an input device 1010, a video/display device 1015, and a storage/output device 1020, although one may include more than one of each of those devices, as desired. Computer device 1005 couples to input device 1010, video/display device 1015, and storage/output device 1020. System 1000 may include more that one computer device 1005, for example, a set of associated computer devices or systems, as desired, and as persons of ordinary skill in the art understand.

System 1000 operates in association with input from a user. The user input typically causes system 1000 to perform specific desired information-processing tasks, including circuit simulation. System 1000 in part uses computer device 1005 to perform those tasks. Computer device 1005 includes an information-processing circuitry, such as a central-processing unit (CPU), although one may use more than one CPU or information-processing circuitry, as persons skilled in the art would understand.

Input device 1010 receives input from the user and makes that input available to computer device 1005 for processing. The user input may include data, instructions, or both, as desired. Input device 1010 may constitute an alphanumeric input device (e.g., a keyboard), a pointing device (e.g., a mouse, roller-ball, light pen, touch-sensitive apparatus, for example, a touch-sensitive display, or tablet), or both. The user operates the alphanumeric keyboard to provide text, such as ASCII characters, to computer device 1005. Similarly, the user operates the pointing device to provide cursor position or control information to computer device 1005.

Video/display device 1015 displays visual images or graphics to the user. The visual images may include information about the operation of computer device 1005, such as graphs, pictures, images, and text. The video/display device may constitute a computer monitor or display, a projection device, and the like, as persons of ordinary skill in the art would understand. If a system uses a touch-sensitive display or touchscreen, the display may also operate to provide user input to computer device 1005.

Storage/output device 1020 allows computer device 1005 to store information for additional processing or later retrieval (e.g., softcopy), to present information in various forms (e.g., hardcopy), or both. As an example, storage/output device 1020 may constitute a magnetic, optical, or magneto-optical drive capable of storing information on a desired medium and in a desired format. As another example, storage/output device 1020 may constitute a printer, plotter, or other output device to generate printed or plotted expressions of the information from the computer device 1005.

Computer-readable medium 1025 interrelates structurally and functionally to computer device 1005. Computer-readable medium 1025 stores, encodes, records, and/or embodies functional descriptive material. By way of illustration, the functional descriptive material may include computer programs, computer code, computer applications, and/or information structures (e.g., data structures or file systems). When stored, encoded, recorded, and/or embodied by computer-readable medium 1025, the functional descriptive material imparts functionality. The functional descriptive material interrelates to computer-readable medium 1025.

Information structures within the functional descriptive material define structural and functional interrelations between the information structures and computer-readable medium 1025 and/or other aspects of system 1000. These interrelations permit the realization of the information structures' functionality. Moreover, within such functional descriptive material, computer programs define structural and functional interrelations between the computer programs and computer-readable medium 1025 and other aspects of system 1000. These interrelations permit the realization of the computer programs' functionality.

By way of illustration, computer device 1005 reads, accesses, or copies functional descriptive material into a computer memory (not shown explicitly in the figure) of computer device 1005. Computer device 1005 performs operations in response to the material present in the computer memory. Computer device 1005 may perform the operations of processing a computer application that causes computer device 1005 to perform additional operations. Accordingly, the functional descriptive material exhibits a functional interrelation with the way computer device 1005 executes processes and performs operations.

Furthermore, computer-readable medium 1025 constitutes an apparatus from which computer device 1005 may access computer information, programs, code, and/or applications. Computer device 1005 may process the information, programs, code, and/or applications that cause computer device 1005 to perform additional operations.

Note that one may implement computer-readable medium 1025 in a variety of ways, as persons of ordinary skill in the art would understand. For example, memory within computer device 1005 may constitute a computer-readable medium 1025, as desired. Alternatively, computer-readable medium 1025 may include a set of associated, interrelated, coupled (e.g., through conductors, fibers, etc.), or networked computer-readable media, for example, when computer device 1005 receives the functional descriptive material from a network of computer devices or information-processing systems. Note that computer device 1005 may receive the functional descriptive material from computer-readable medium 1025, the network, or both, as desired.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:

1. A semiconductor die comprising:
   a first flexible interface block, comprising:
   at least one interconnect;
   at least one buffer coupled to the at least one interconnect;
   a routing interface coupled to circuitry integrated in the semiconductor die; and
   a controller coupled between the routing interface and the at least one buffer to provide communication between the routing interface and the at least one buffer.

2. The semiconductor die according to claim 1, wherein the first flexible interface block is adapted to provide communication between a first circuit integrated in the semiconductor die and a second circuit external to the semiconductor die.

3. The semiconductor die according to claim 2, wherein the second circuit is adapted to operate according to a protocol, and the controller may be adapted to provide communication to the second circuit using the protocol.

4. The semiconductor die according to claim 2, wherein the first flexible interface block is adapted to provide a customizable interface between the first and second circuits.

5. The semiconductor die according to claim 1, wherein the controller includes hardened logic circuitry.

6. The semiconductor die according to claim 1, wherein the controller includes structured application specific integrated circuit (ASIC) circuitry.

7. The semiconductor die according to claim 1, wherein the controller includes programmable logic circuitry.

8. The semiconductor die according to claim 1, comprising a programmable logic device (PLD), wherein the PLD comprises the first flexible interface block.

9. The semiconductor die according to claim 8, wherein the first flexible interface block is coupled to programmable interconnect of the PLD.

10. The semiconductor die according to claim 9, wherein the programmable interconnect couples to programmable logic.

11. The semiconductor die according to claim 1, further comprising a second flexible interface block, wherein the first and second flexible interface blocks are arranged in a row or in a column.

12. A method of fabricating a semiconductor die, the method comprising:
fabricating a first flexible interface block, comprising:
fabricating at least one interconnect;
fabricating at least one buffer coupled to the at least one interconnect;
fabricating a routing interface coupled to circuitry integrated in the semiconductor die; and
fabricating a controller coupled to provide communication between the routing interface and the at least one buffer, wherein the at least one buffer is external to the routing interface.

13. The method according to claim 12, further comprising fabricating a first circuit in the semiconductor die; wherein the first flexible interface block is adapted to provide communication between the first circuit and a second circuit external to the semiconductor die.

14. The method according to claim 13, wherein the second circuit is adapted to operate according to a protocol, and the controller may be adapted to provide communication to the second circuit using the protocol.

15. The method according to claim 13, wherein the first flexible interface block is adapted to provide a customizable interface between the first and second circuits.

16. The method according to claim 12, wherein fabricating the controller includes fabricating hardened logic circuitry.

17. The method according to claim 12, wherein fabricating the controller includes fabricating structured application specific integrated circuit (ASIC) circuitry.

18. The method according to claim 12, wherein fabricating the controller includes fabricating programmable logic circuitry.

19. The method according to claim 12, wherein fabricating the first flexible interface block comprises fabricating the first flexible interface block in a programmable logic device (PLD).

20. The method according to claim 19, wherein fabricating the first flexible interface block further comprises coupling the first flexible interface block to programmable interconnect of the PLD.

21. The method according to claim 20, wherein the programmable interconnect couples to programmable logic.

22. The method according to claim 12, further comprising fabricating a second flexible interface block, wherein the first and second flexible interface blocks are arranged in a row or in a column.

* * * * *